United States Patent [19]

Jahne et al.

[11] Patent Number: 5,714,956
[45] Date of Patent: Feb. 3, 1998

[54] PROCESS AND SYSTEM FOR THE ANALOG-TO-DIGITAL CONVERSION OF SIGNALS

[75] Inventors: Helmut Jahne; Olaf Altenburg; Klaus Cain; Detlef Kutschabsky, all of Berlin, Germany

[73] Assignee: Stage Tec Entwicklungsgesellschaft für professionelle Audiotechnik mbH, Germany

[21] Appl. No.: 584,535

[22] Filed: Jan. 11, 1996

[30] Foreign Application Priority Data

Jan. 12, 1995 [DE] Germany ............ 195 02 047.2

[51] Int. Cl.$^6$ ............ H03M 1/10; H03M 1/06
[52] U.S. Cl. ............ 341/155; 341/139
[58] Field of Search ............ 341/139, 155, 341/120

[56] References Cited

U.S. PATENT DOCUMENTS

| | | |
|---|---|---|
| 4,129,864 | 12/1978 | Carpenter et al. |
| 4,937,579 | 6/1990 | Maio et al. ............ 341/165 |
| 4,999,628 | 3/1991 | Kakubo et al. |
| 5,093,660 | 3/1992 | Beauducel ............ 341/139 |
| 5,499,027 | 3/1996 | Karanicolas et al. ............ 341/120 |

FOREIGN PATENT DOCUMENTS

| | | |
|---|---|---|
| 0346605 | 12/1989 | European Pat. Off. |
| 3611922 | 10/1987 | Germany. |
| 87/06080 | 10/1987 | WIPO. |

OTHER PUBLICATIONS

Horst Zander, "Datenwandler A/D–und D/A–Wandler-–Schnittstellender diitalen Signalverareitung" Vogel Verlag und Druck KG, Würzburg, Germany; 1990; pp. 106–117.

Primary Examiner—Jeffrey A. Gaffin
Assistant Examiner—Peguy JeanPierre
Attorney, Agent, or Firm—Londa and Traub LLP

[57] ABSTRACT

System for analog-digital conversion of signal using at least two less highly resolving AD converters, each having a different preamplification, wherein the AD converter having the most favorable resolution of the momentary signal is utilized to compute therefrom the digital output signal of the system. The preamplifications do not have to be precisely known, but are determined by means of the digital signals formed by the conversion. Preamplification errors, such as offset errors or transmit time errors, are eliminated by choosing the appropriate computation algorithm.

24 Claims, 1 Drawing Sheet

PROCESS AND SYSTEM FOR THE ANALOG-TO-DIGITAL CONVERSION OF SIGNALS

BACKGROUND OF THE INVENTION

The invention relates to a process for the analog-to-digital conversion of signals, and to an apparatus for carrying out the process; the field of application of the invention is in sensing technology, measuring technology, audio technology, and also in the broad field of application-specific microprocessor use.

It is known that analog signals with a great dynamic range, i.e., signals of low and high values, can be digitalized only inaccurately as regards the low values. The result is relatively great miscalculations during further digital processing and an increase in the distortion factor in diminishing signals. For this reason, AD converters with a high resolution are used in the above-mentioned cases although the more precise digitalization that can be achieved thereby often is not needed and, in addition, high-resolution AD converters are considerably more expensive. Digital processing has been entirely impossible for a number of applications, since converters with such high resolution at the corresponding conversion rates have long been unavailable. One witness of this is the studio microphone for professional use with integrated AD converter.

In all these areas it has long been attempted to equip lower-cost converters of lower resolution with switchable preamplification.

In German examined patent application DE-OS 4312697 the problem of an AD converter of high resolution has been solved with two AD converters of lesser resolution and a DA converter of high resolution. So the problem is just shifted to the DA converter.

In German examined patent application DE-OS 3603833 a controlled amplifier (VCA) is used in order to keep an AD converter of lower resolution always in the optimum working range. With a second AD converter of lower resolution the control voltage of the VCA is digitalized and linked to the digital signal of the first AD converter according to an exponent. Problematical, for one thing, is the nonlinear control characteristic of each VCA, and another is the VCA itself. The best VCA's obtainable today have a high background noise and substantially greater signal distortion than good AD converters.

A basically different approach has been taken in German Examined Patent Application DE-OS 2946502. In this case a high-resolution AD converter for seismic signals is described, which is constructed with an AD converter of relatively low resolution, plus a plurality of preamplifiers having fixed and known signal amplification. Depending on the magnitude of the signal to be digitalized, the AD converter is connected to the appropriate preamplifier, and the digital signal is obtained by division by the amplification factor. The same method is described also in DE-OS 3816903.

This idea is carried further in DE-OS 3611922. A high-resolution AD converter is described, which consists of two AD converters of lesser resolution, one being driven by a preamplifier. The digital signal of this AD converter is then divided by the preamplification factor. The recognized deficiencies of a process of this kind are, for example, inaccuracies in the preamplification factor and inaccuracies in the AD converter, and the completely disregarded offset errors of all analog components are lessened by a "sliding transition" between both digitalized values in the effects they produce.

In DE-OS 3820144 high-resolution AD and DA converters for audio technology are described with the aim of constructing a 20-bit AD converter from 16-bit AD converters. The deficiencies acknowledged in DE-OS 3611922 are still completely disregarded, although a 20-bit AD converter has substantially more precise preamplification requirements than, for example, a 12-bit AD converter. A voltage divider with an accuracy of 0.0001% for a 20 bit AD converter is virtually uncontrollable in a series apparatus in audio technology—certainly not where multiple cascading is involved.

Any use of multi-channel 8 to 12 bit AD converters integrated on microprocessor chips for AD converters of higher resolution, and any increase in the resolution of AD converters up to 24 or even 28 bits with scanning frequencies in the 100 kHz range, are rendered impossible by the offset errors and amplification errors of the analog component units. Even in the case of precision equalization, temperature and aging problems can no longer be overcome. Good microphones have a dynamic range of 125 to 135 dB, so that only a 24-bit AD converter does not limit the use of such a microphone. In the case of microphone amplifiers suitable for both dynamic and condenser microphones, as much as 27- to 28-bit converters are necessary if no adjustment is made in the preamplification.

The invention is addressed to the problem of creating a process and an apparatus for high-resolution analog-digital conversion using AD converters of less than high resolution so that it will be possible in a simple manner, without precision components, and without equalization of the system, to digitalize an analog signal with a high dynamic range.

The problem is solved according to the invention by digitalizing the analog signal of a plurality of AD converters of less than high resolution, each of which has a different preamplification, so that it is possible to utilize the AD converters with the most favorable resolution of the momentary signal in order to compute therefrom the digital output signal of the system, the preamplifications not having to be known precisely in detail but being determined by means of the digital signals formed by the conversion. The preamplification can even contain errors, such as offset errors or transit time errors. On account of the constant input of the corrections, it is possible to use components having broad tolerances and relatively great drift and aging. Depending on the chosen computation algorithms, these errors can be eliminated. The greater the amount of computation, and hence also the computing time or the performance of the processor, the greater will be the amount of errors that can be eliminated.

For the simplest systems, in which the offsets of the amplifiers and AD converters are sufficiently good or are kept small by other offset correcting means, it is sufficient to determine only the amplification, and with this information to convert the digital signals of the AD converter with the greatest preamplification such that, for a particular range of the analog signal, both of the AD converters make equal conversion results available. Outside of this range the AD converter with the least preamplification at high analog signals, and the one with the greatest preamplification at low analog signals, determines the digital output signal of the system. The amplification is expediently determined by division of the two digital values, provided that there is no overloading and therefore invalid conversion results of the AD converter with the greater preamplification. To forestall any errors it is desirable to average the calculated amplification factors, which is done by means of an evaluation factor d. The same simple method can be used when an offset voltage of fixed magnitude, such as occurs in certain offset correction methods, is present.

Greater effort is necessary if both the offset and the amplification are unknown. In these cases it is not easy to determine new correction values, since it is not possible to describe a plurality of unknowns with an equation. What is necessary is a knowledge over a plurality of supporting points, or, if the input signal is not permanently constant, a knowledge of the past will also suffice, so that a recursive process for determining the corrections will be possible.

The computation of the correction factors is to be omitted when the digital signals of the AD converter are very low, since in these cases the resolution of the digital factors becomes inaccurate, and thus also the algorithms on which they are based. Also if signals are for a long period of time within a range that does not permit the precise determination of the correction factors, the latter must not be changed, either.

If the correction of the amplification and offset is successful, it is not necessary, in connection with analog-digital conversion, to bring about a sliding transition between the individual AD converters; it can be desirable for other effects, however, as in the case of audio applications, for example, since the ear is capable of perceiving sudden changes in the background noise. This is undoubtedly the case whenever a range limit for an AD converter is reached. Moreover, it is possible to reduce the effect of error sources not included in the correction, such as transit time errors. Expediently, a linear weighting function is determined which defines the closeness of applicability ranges of the AD converter.

In the case of a diminishing signal, special attention must be given to the transition from an AD converter with low preamplification to an AD converter with greater preamplification, since in this case an overloading of the preamplifier or of the AD converter that has the greater amplification has immediately preceded it. Before the digital signal of the AD converter with the greater preamplification is used it is necessary to wait for the recovery or build-up to reach the necessary accuracy, which then quickly results in a reduction of the resolution of the entire AD converter. Usually this time is quite brief, so that it is not any significant disadvantage. In the case of oversampling AD converters, however, a "reduction filter" is used, which after an overloading of the AD converter produces [an overloading of the AD converter produces ] incorrect values for the duration of the filter transit time, since an overloading of an AD converter generally also signifies a violation of the scanning theorem. When such AD converters are used, if any rougher resolution of a signal is unacceptable for the duration of the reduction filter's transit time, the process described is to be executed ahead of this reduction filter. In addition to offset and amplification, still other sources of error may affect the conversion of the various AD converters. This includes transit time errors and filter properties, usually low-pass properties, of the preamplifiers. If allowance is made for these properties in selecting a correction process, these errors also can be compensated.

SUMMARY OF THE INVENTION

An AD converter in accordance with the invention can be produced by a variety of methods. For the reasons described above, in the case of more than two correction factors, a knowledge of the results of past conversion in some form or other is necessary. It can be, for example, a method in which, on the basis of the amplification and offset magnitudes known up to now, an additional pair of values of a linear equation is computed, the momentary value of the signal being converted having in the present case a negative sign. Now, the new values for amplification and offset are determined on the basis of a straight line which passes through the calculated point and the point determined by analog-digital conversion. This process is generally characterized in that the recursive computation of the inverse amplification is performed according to the equation: $a:=a+(((x1+a*x2-b)/2/x2)-a)*d)$, where d represents a very low number, for example 0.001, which determines the recursion rate. Further, the assumed negative offset is actualized by recursive computation according to the formula $b:=b+(((x1-a*x2+b)/2)-b)*d)$, where d is equal to the above-stated value d, without limitation of the universality.

Another process for an AD converter according to the invention can be used only in the case of bipolar signals. It is based on the fact that there are two ranges in which two bipolar AD converters convert digital signals suitable for computation, namely a positive range and a negative range. Each conversion result of a range corrects an auxiliary point associated with this range. The equation that describes the straight line through the positive and negative auxiliary points contains the amplification that was to be determined and the offset that was to be determined. Thus, in the case of bipolar signals, the recursive computation of the inverse amplification and of the negative offset is based on a positive auxiliary magnitude (p) and a negative auxiliary magnitude (n). The positive auxiliary magnitude (p) is computed at the positive base point (xp) and the negative auxiliary magnitude (p) at the negative base point (xn). The values of the positive base point are selected close to or equal to the positive full-scale value of the second digital signal (x2) and the values of the negative base point are selected close to or equal to the negative full-scale value of the second digital signal (x2). Furthermore, if the first digital signal (x1) is greater than zero, the auxiliary magnitude (p) is computed by the equation $p:=p+((x1)+(xp-x2)*a+b)-p)*d$, and if the first digital signal (x1) is less than zero, the auxiliary magnitude (n) is computed by the equation $n:=n+((x1+(xn-x2)*a+b)-p)*d$, where d is a very small number, for example 0.001, which establishes the recursion rate. The computation of the inverse amplification is performed according to the formula: $a=(p-n)/(xp-xn)$ and the computation of the negative offset according to the formula $b=(xp*n-xn*p)/(xp-xn)$.

Both of the processes described above are characterized by a good recurrence speed, but call for considerable computing, for high-precision division, for example. A very easy process, similar to a counting AD converter, is based on separate collecting of errors of positive and negative signals. Depending on the sign of these errors, the offset or amplification are varied in small steps, which should be so small that an individual step leads to such small variations of the result that it is negligible in relation to the maximum resolution of one of the participant AD converters. Such a system for analog-digital conversion is characterized in that, in the case of bipolar signals, the recursive computation of the inverse amplification and negative offset is based on an incremental correction. A first auxiliary magnitude (p) and a second auxiliary magnitude (n) are introduced, while in case the first digital signal (x1) is greater than zero, and the first digital signal (x1) is greater than the product of the second digital signal (x2) multiplied by the assumed inverse amplification (a), plus the negative assumed offset (b) (x1>a*x2+xb), the first auxiliary magnitude is made equal to +1. If the first digital signal (x1) is lower than the product of the second digital signal (x2) multiplied by the assumed inverse amplification (a), plus the negative assumed offset (b) (x1>a*x2+b), the first auxiliary magnitude (p) is made equal to the value −1, and in case the first digital signal (x1) is less than zero. Further, the first digital signal (x1) is greater than the product of the multiplication of the second digital signal (x2) by the assumed inverse amplification (a), plus the negative assumed offset (b) (x1<a*x2+b), the second auxiliary magnitude (n) is made equal to the value +1. And if the first digital signal (x1) is less than the second digital signal (x2) multiplied by the assumed inverse amplification (a), plus the negative assumed offset (b) (x1<a*x2+b), the second auxiliary magnitude is made equal to the value −1. Furthermore, if the first auxiliary magnitude (p) and the second auxiliary magnitude (n) are equal to +1, the negative offset (b) is increased and the first and second auxiliary magnitudes (p)(n) are set at zero. If the first auxiliary magnitude (p) and the second auxiliary magnitude (n) are equal to −1 the negative offset is decreased, and the first and second auxiliary magnitudes (p)(n) are set at zero. If the first auxiliary magnitude (p) is equal to +1 and the second auxiliary magnitude (n) is equal to −1, the inverse amplification (a) is increased and the first and second auxiliary magnitudes (p) (n) are made equal to zero. If the first auxiliary magnitude (p) is equal to −1, and the second auxiliary magnitude (n) is equal to +1, the inverse amplification (a) is decreased and the first and second auxiliary magnitudes (p) (n) are made equal to zero, and that furthermore the decreasing and increasing are performed in sufficiently small steps.

The ranges in which individual AD converters contribute to the digital output signal of the overall AD converter are determined by limitation. There is the possibility of varying also these limits by means of the values determined for the negative offset b and the inverse amplification a, resulting in an improved resolution of the AD converter due to the optimum utilization of the ranges.

In the case of oversampling AD converters, however, additional safety against overloading is necessary, since it is possible that between two scanned values in the acceptable range scanned values of greater amplitude may have occurred following the "reduction filter." In the extreme case, a signal close to half the sampling frequency can provoke internal overloading even above 0.7071 times the full-scale level. This must be taken into account in the computation of varying thresholds.

Furthermore according to the invention it is possible to cascade the process. This is based on the following thinking. An AD converter has its maximum resolution of a signal at the modulation threshold. If the signal decreases the relative resolution of the signal decreases until the first threshold is reached. At this point it again has its maximum resolution, this time on account of the second AD converter. If the offset is negligible, the decline of the relative resolution of the signal with respect to the best possible resolution corresponds precisely to the difference in preamplification between the two AD converter channels. By this rule it is possible to calculate the maximum acceptable preamplification difference between two AD converter channels whenever the resolution of the AD converter in use and the desired resolution of the AD converter according to the invention are known. If the signal range in which the desired resolution of the AD converter of the invention is to prevail is divided by the determined maximum allowable amplification, the number of the AD converters to be cascaded is obtained.

BRIEF DESCRIPTION OF THE DRAWINGS

The invention will be further explained with two examples. In the drawings.

DETAILED DESCRIPTION OF THE PREFERRED EMBODIMENTS

Figure 1:
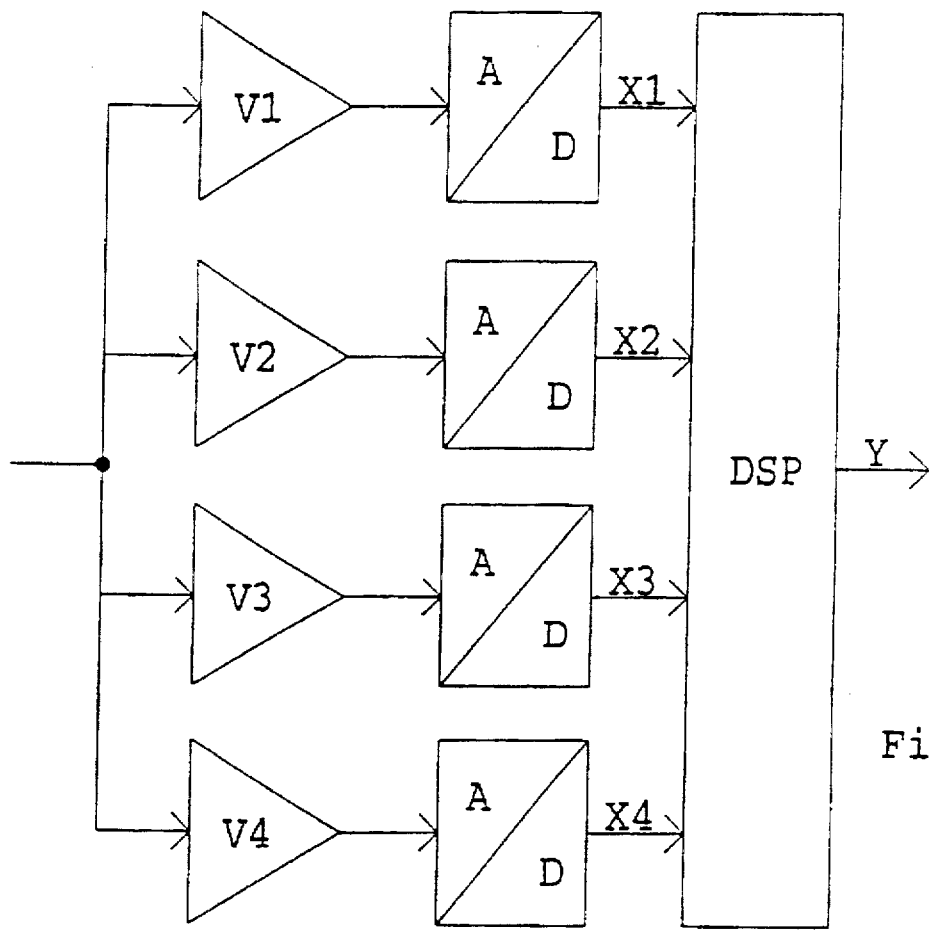
FIG. 1 represents a parallel arrangement of a plurality of AD converters with preamplifiers.

In the first example, an AD converter is to be designed which will resolve an analog signal in the range of 0.1 to 1 V with an accuracy of 1%. Available are 8-bit AD converters with a useful dynamic of 46 dB and an input voltage range of 0 to 2 volts. In accord with the description, the maximum allowable preamplification difference between the individual AD converters is figured at 6 dB. The signal range in which the 1% resolution is required is 20 dB, so that the minimum number of 8-bit AD converters used is figured at 3.33, or 4. The preamplification difference is established at 5 dB, and thus the four preamplifiers are: V1=6 dB, V2=11 dB, V3=16 dB, and V4=21 dB. The result is an arrangement for a system for analog-digital conversion of signals using at least two less highly resolving AD converters, characterized in that the analog signal on the one hand is fed unamplified to a first digital signal (x1) and on the other hand, after signal processing, generally an error-ridden amplification greater than one, whose magnitude does not have to be exactly known, is converted to a second digital signal (x2). In the case that the value of the second digital signal (x2) is with great probability in a range in which it was provoked by overloading, expediently by exceeding a first threshold (s1) on the amount of the first digital signal (x1) (ABS(x1)>s1), the digital output signal (y) results from the first digital signal (x1) (y=x1). Also, in the other case the digital output signal (y) is obtained by multiplying the second digital signal (x2) by the assumed inverse amplification (a) (y=a*x2), and furthermore, in this case the assumed inverse amplification is actualized by recursive computation.

At these low resolutions an offset correction is not needed, and therefore the following arrangement and process are used. Since the signal sharp in time is not to be limited it is expedient to perform a recomputation of the amplification difference only if sufficiently accurate conversions are available. Therefore a process is used such that when the value of the second digital signal (x2) is with great probability in a range in which it was provoked by overloading, expediently determined by exceeding a first threshold (s1) of the amount of the first digital signal (x1) (ABS(x1)>s1), the digital output signal (y) results from the first digital signal (y=x1). Further, in the other case the digital output signal (y) results from multiplying the second digital signal (x2) by the assumed inverse amplification (a) and adding the negative assumed offset (b) (y=a*x2+b). Additionally, when the value of the first digital signal (x1) is in a range in which the amount of the first signal (s1) falls below a first threshold (s1) but exceeds a second, smaller threshold (s2) (s1<ABS (x1)<s2), the assumed inverse amplification and the assumed negative offset are actualized by recursive computation; for if the second threshold (s2) is not reached the resolution of the first digital signal (x1) is so poor that recursive computation could be performed only with great errors.

Since only unipolar analog signals are converted, a simplified process can be used where the formation of the level of the first digital signal (x1) by comparison with the first threshold (s1) can be eliminated. On account of the small amplification difference between the individual converters, of only 5 dB, it is desirable to maintain the thresholds very precisely, and therefore they are to be varied automatically and thus adapted to the actual amplification. Therefore, any of the following processes can be used. One system is characterized in that the first threshold (s1) is computed cyclically. Secondly, in the case of negligibly small negative offset, the first threshold (s1) is equal to the full-scale value of the first digital signal (x1) multiplied by the assumed inverse amplification (a) (s1=a*FS). In another, analog-digital conversion system, the second threshold (s2) is computed cyclically. Further to this system, the second threshold (s2) may also be equal to the first threshold (s1) multiplied by the assumed inverse amplification (a) (s1=a*s2).

The quadruple cascading of the 8-bit AD converters is described as a system for analog-digital conversion of signals using a plurality of less highly resolving AD converters. There, the analog signal is on the one hand converted without amplification to a first digital signal (x1) and, after a signal processing, generally an error-containing amplification by greater than 1, the magnitudes of which need not be known precisely, to a plurality of digital signals (x2 ... xn), for each pair of digital signals, whereby a cascading takes place.

On account of the fundamental amplification V1, the process and the arrangement is also used, characterized in that the analog signal for obtaining the first digital signal (x1) is also converted to the digital signal (x1) until after a signal processing, too, different from signal processing for the second digital signal (x2), generally an error-containing amplification, whose magnitudes need also not be known precisely, thus reducing especially transit time errors.

Figure 2:
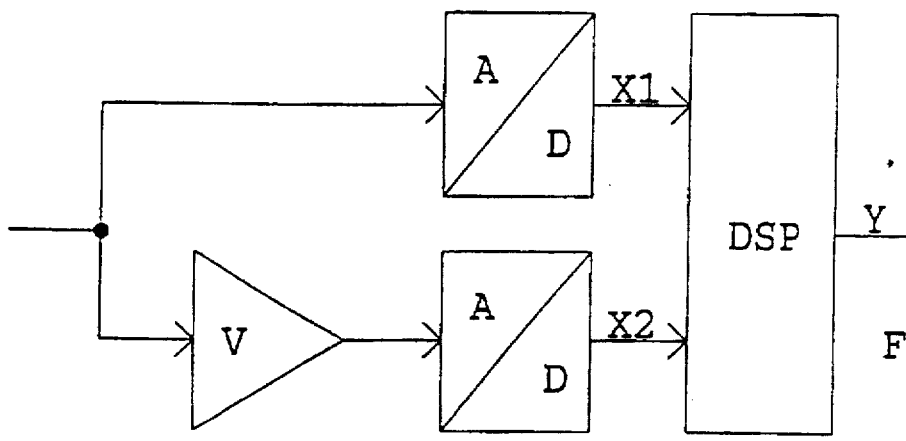
FIG. 2 represents a parallel arrangement of AD converters wherein a preamplifier precedes an AD converter.

In a second example an AD converter is to be designed to convert an audio signal in a range of 60 dB with a maximum distortion of 0.01%, i.e., a distortion damping of 80 dB. Available are oversampling AD converters with a dynamic range of 110 dB. In accordance with the description, the maximum difference in amplification is figured at 30 dB and the number of AD converters needed at two, so that here a stereo AD converter can be used. The arrangement can be seen in FIG. 2. In such AD converters it is necessary to include both the amplification and the offset in the algorithm. The result is a system using at least two less highly resolving AD converters. In this system the analog signal is, on the one hand, converted unamplified to a first digital signal (x1), and on the other hand, is converted, after signal processing, generally an amplification greater than one, containing errors whose magnitude need not be known precisely, to a second digital signal (x2). In the case where the value of the second digital signal (x2) is with great probability in a range in which it was provoked by overloading, expediently obtained by exceeding a first threshold (s1) of the amount of the first digital signal (x1) (ABS(x1)>s1), the digital output signal (y) results from the first digital signal (x1) (y=x1). In the other case, the digital output signal (y) results from a multiplication of the second digital signal (x2) by the assumed inverse amplification (a) and the addition of the negative assumed offset (b) (y=a*x2+b). Furthermore in this case, the assumed inverse amplification and the assumed negative offset are actualized by recursive computation.

In this case too, the time curve of the signal cannot be restricted and especially it is quite possible that a very low signal will be present over a relatively long period of time. Consequently it is expedient to perform the recalculation of the amplification differences only if sufficiently accurate conversion results are on hand, and therefore a process as follows is used. This system is characterized in that in case where the value of the second digital signal (x2) is with great probability in a range in which it was provoked by overloading, expediently determined by exceeding a first threshold (s1) of the amount of the first digital signal (x1) (ABS(x1)>s1), the digital output signal (y) results from the first digital signal (y=x1). In a further case the digital output signal (y) results from multiplying the second digital signal (x2) by the assumed inverse amplification (a) and adding the negative assumed offset (b) (y=a*x2+b). Additionally where the value of the first digital signal (x1) is in a range in which the amount of the first signal (s1) falls below a first threshold (s1) but exceeds a second, smaller threshold (s2) (s1<ABS(x1)<s2), the assumed inverse amplification and the assumed negative offset are actualized by recursive computation; for if the second threshold (s2) is not reached the resolution of the first digital signal (x1) is so poor that recursive computation could be performed only with great errors.

For audio signals it is important that in the case of slow signal changes there will be no discontinuities in the background noise, and therefore the following processes are used. In the first process, the value of the second digital signal (x2) is with great probability in a range in which it was provoked by overload, expediently determined by exceeding a first threshold (s1) of the amount of the first digital signal (x1) (ABS(x1)>s1). There, digital output signal (y) results from the first digital signal (x1) (y=x1), where the value of the first digital signal (x1) falls below the first threshold (s1), and furthermore falls below a second, smaller threshold (s2) (ABS(x1)<s2), the digital output signal results from a multiplication of the second digital signal (x2) by the assumed inverse amplification (a) and the addition of the negative assumed offset (b) (y=a*x2+b).

If neither of the first two cases applies, that is to say the value of the first digital signal (x1) is in a range in which the level of the first digital signal (x1) falls below a first threshold (s1) but exceeds a second, smaller threshold (s2) (S1>ABS(x1)>s2), a weighting function is formed which permits blending between the two formulas, such that the digital output signal (y) is formed from the sum of the first digital signal (x1) multiplied by the weight (g) and the inverse weight (1−g) multiplied by the sum of the negative assumed offset (b) and from the multiplication of the second digital signal (x2) by the assumed inverse amplification (a) (y=g*x1+(1−g)*(a*x2+b)). Furthermore, the assumed inverse amplification and the assumed negative offset are actualized by recursive computation. In a further system, the weight (g) is a linear function and equal to the quotient of the difference between the level of the first digital signal (x1 and the second threshold (s2) divided by the difference between the first threshold (s1) and the second threshold (s2), (g=ABS(x1)−S2)/(s1−s2).

On account of the oversampling in the AD converters a signal transit time is to be expected in the reduction filter, and therefore not until after the completion of a certain number of samples will the conversion results of the AD converter that has the greater preamplification have any effect on the output signal of the system. Accordingly, a system for the analog-digital conversion is used such that where the level of the second digital signal (x2) is with great probability in a range in which it was provoked by overload, expediently determined by exceeding a first threshold (s1) of the level of the first digital signal (x1), and also in cases where the time since the level of the first digital signal (x1)

exceeded the first threshold (s1) (ABS(x1)>s1) is less than a given time (t), the digital output signal (y) results from the first digital signal (x1), while in the other cases the procedure is as described before. This system may be further characterized in that, in periodical sensing of the signal, the number of periods after the level of the first digital signal (x1) exceeds the first level is counted in order to obtain a standard for the time (t).

If there is sufficient computing capacity, a recursive computation is desirable. The recursive computation of the inverse amplification is performed according to the equation: $a:=a+(((x1+a*x2-b)/2/x2)-a)*d$, where d represents a very low number, for example 0.001, which determines the recursion rate. Also, the assumed negative offset is actualized by recursive computation according to the formula $b:=b+(((x1-a*x2+b)/2)-b)*d$, where d is equal to the above-stated value d, without limitation of the universality.

To fully utilize the resolution of the AD converters employed, all of the thresholds are also to be adapted as follows. In one system, the first threshold (s1) is computed cyclically. Further, in the case of negligibly small negative offset, the first threshold (s1) is equal to the full-scale value of the first digital signal (x1) multiplied by the assumed inverse amplification (a) (s1=a*FS). Similarly, in another system the second threshold (s2) is computed cyclically. This system is also characterized in that the second threshold (s2) is equal to the first threshold (s1) multiplied by the assumed inverse amplification (a) (s1=a*s2).

By means of the oversampling process in the AD converters, attention should also be paid to the possibility of internal overloading in signals that are greater than 0.7071 times the full-scale value. Hence, a process can be used whereby any internal overloading near the first threshold (s1) is avoided, characterized in that, in the case of negligibly small negative offset, the first threshold (s1) is equal to the full-scale value of the first digital signal (x1) multiplied by the assumed inverse amplification (a) and multiplied by a constant (c) which typically is slightly smaller than one (s1=a*c*FS), in which the constant c has a value of 0.7.

In the case of the oversampling AD converters an offset balancing is usually performed automatically after power-up. It is expedient that this be followed immediately by a calibration in order to determine the amplification and offset levels that are necessary to error-free operation. This is accomplished by a calibration signal with a frequency of about 1 kHz and an amplitude that is between −60 and −33 dB below the level of the fully modulated signal, while a higher level, on account of the then greater resolution of the AD converters, leads to a more precise determination of the correction values. This process corresponds to a system characterized in that, after power-up cyclically or on demand, a calibration signal is applied to the system for the analog-digital converter, whereby the values are obtained which are necessary for the operation.

We claim:

1. Process for analog-digital conversion of signals using at least two less highly resolving AD converters, characterized in that a analog signal on the one hand is fed unamplified to a first digital signal (x1) and, on the other hand, after signal processing, an error-ridden amplification greater than one, whose magnitude does not have to be exactly known, is converted to a second digital signal (x2), while in the case that a) the value of the second digital signal (x2) is in a range in which it was provoked by overloading, determined by exceeding a first threshold (s1) on the amount of the first digital signal (x1) (ABS(x1)>s1) the digital output signal (y) results from the first digital signal (x1) (y=x1), and that, in the other case, b) the digital output signal (y) is obtained by multiplying the second digital signal (x2) by the current inverse difference-amplification (a) (y=a*x2), and furthermore that in this case the current inverse difference-amplification is actualized by recursive computation with momentary values of the first and the second digital signal (x1), (x2), realizing that recursive computation starts with a fixed value.

2. The process according to claim 1, characterized in that the recursive computation of the current inverse difference-amplification is performed in accordance with the formula: $a:=a+((x1/x2)-a)*d$, wherein d is a very small number, for example 0.001, which establishes a rate of recursion.

3. The process according to claim 1, characterized in that in the first place the analog signal is converted unamplified to a first digital signal (x1) and secondly, after signal processing, generally an amplification greater than one containing errors, whose magnitude need not be known precisely, but with fixed difference offset is converted to a second digital signal (x2), while if a) the value of the second digital signal (x2) is in a range in which it was provoked by overloading, determined by exceeding a first threshold (s1) of the amount of the first digital signal (x1) (ABS(x1)>s1) the digital output signal (y) results from the first digital signal (x1) (y=x1), and that in the other case b) the digital output signal (y) results from a multiplication of the second digital signal (x2) by the current inverse difference-amplification (a) and the addition of the fixed difference offset (b) (y=a*x2+b), and furthermore that in this case the current inverse difference-amplification is actualized by recursive computation.

4. The process according to claim 3, characterized in that the recursive computation of the inverse difference amplification is performed according to the formula: $a:=a+(((x1=a*x2-b)/2/X2-a)*d$, wherein b represents the known offset and d represents a very small number, for example 0.001, which establishes a rate of recursion.

5. The process according to claim 1, characterized in that the analog signal is on the one hand converted unamplified to a first digital signal (x1) and on the other hand is converted, after signal processing, generally an amplification greater than one, containing errors, whose magnitude need not be known precisely, to a second digital signal (x2), while in the case that a) the value of the second digital signal (x2) is in a range in which it was provoked by overloading, determined by exceeding a first threshold (s1) of the amount of the first digital signal (x1) (ABS(X1)>S1), the digital output signal (y) results from the first digital signal (x1) (y=x1), and that in the other case b) the digital output signal (y) results from a multiplication of the second digital signal (x2) by the current inverse difference-amplification (a) and the addition of a current negative difference offset (b) (y=a*x2+b), and furthermore that in this case the current inverse difference-amplification and the current negative difference offset are actualized by recursive computation.

6. The process according to claim 5, characterized in that the recursive computation of the inverse difference-amplification is performed according to the equation: $a:=+(((x1+a*x2-b)/2/x2)-a)*d$, wherein d represents a very low number, for example 0.001, which determines a recursion rate, and that the current negative difference-offset is actualized by recursive computation according to the formula b:=b+(((x1−p*x2+b)/2)−b)*d), wherein d is equal to the above-stated value d, without limitation of the universality.

7. The process according to claim 5, characterized in that, in the case of bipolar signals, the recursive computation of the inverse difference-amplification and of the negative difference-offset is based on a positive auxiliary magnitude (p) and a negative auxiliary magnitude (n), the positive auxiliary magnitude (p) being computed at the positive base point (xp) and the negative auxiliary magnitude (p) at the negative base point (xn), and the values of the positive base point are selected close to or equal to the negative full-scale value of the second digital signal (x2), and that furthermore, if the first digital signal (x1) is greater than zero, the auxiliary magnitude (p) is computed by the equation p:=p+ ((x1)+(xp−x2)*a+b)−p)*d, and that if the first digital signal (x1) is less than zero, the auxiliary magnitude (n) is computed by the equation n :=n+((x1+(xn−x2)*a+b)−p)*d wherein d is a very small number, for example 0.001, which establishes the recursion rate, and that the computation of the inverse difference-amplification is performed according to the formula: a=(p−n)/(xp−xn) and the computation of the negative difference-offset according to the formula b=(xp*n−xn*p)/(xp−xn).

8. The process according to claim 5, characterized in that in the case of bipolar signals the recursive computation of the inverse amplification and negative offset is based on an incremental correction; that a first auxiliary magnitude (p) and a second auxiliary magnitude (n) are introduced, while in case the first digital signal (x1) is greater than zero, and the first digital signal (x1) is greater than the product of the second digital signal (x2) multiplied by the current inverse difference-amplification (a), plus the current negative difference offset (b) (x1<a*x2+xb), the first auxiliary magnitude is made equal to +1, and if the first digital signal (x1) is lower than the product of the second digital signal (x2) multiplied by the current inverse difference-amplification (a), plus the current negative difference-offset (b) (x1<a*x2+b), the first auxiliary magnitude (p) is made equal to the value −1, and in case the first digital signal (x1) is less than zero, and if the first digital signal (x1) is greater than the product of the multiplication of the second digital signal (x2) by the current inverse difference-amplification (a), plus the negative difference-offset (b) (x1<a*x2+b), the second auxiliary magnitude (n) is made equal to the value +1, and if the first digital signal (x1) is less than the second digital signal (x2) multiplied by the current inverse difference-amplification (a), plus the current negative difference-offset (b) (x1<a*x2+b), the second auxiliary magnitude is made equal to the value −1, and that furthermore, if the first auxiliary magnitude (p) and the second auxiliary magnitude (n) are equal to +1, the negative offset (b) is increased, and the first and second auxiliary magnitudes (p)(n) are set at zero; that if the first auxiliary magnitude (p) and the second auxiliary magnitude (n) are equal to −1 the negative offset is decreased, and the first and second auxiliary magnitudes (p)(n) are set at zero; that if the first auxiliary magnitude (p) is equal to +1 and the second auxiliary magnitude (n) is equal to −1, the inverse amplification (a) negative difference-offset(b) is increased and the first and second auxiliary magnitudes (p) and (n) are set at zero; that if the first auxiliary magnitude (p) is equal to −1, and the second auxiliary magnitude (n) is equal to +1, the inverse difference-amplification (a) negative offset (b) is decreased and the first and second auxiliary magnitudes (p) and (n) are set at zero, and that furthermore the decreasing and increasing are performed in sufficiently small steps.

9. The process according to claim 1, characterized in that in case the value of the first digital signal (xl) is in a range in which the amount of the first signal (s1) falls below a first threshold (s1) but exceeds a second, smaller threshold (s2) (s1>ABS(x1)>s2), the current inverse difference-amplification (a) and the current negative difference offset are actualized by recursive computation; for if the second threshold (s2) is not reached the resolution of the first digital signal (x1) is so poor that recursive computation could be performed only with great errors.

10. The process according to claim 9, characterized in that the second threshold (s2) is computed cyclically.

11. The process according to claim 10, characterized in that the second threshold (s2) is equal to the first threshold (s1) multiplied by the assumed inverse amplification (a) (s1=a*s2).

12. The process according to claim 1, characterized in that, in case the value of the first digital signal (x1) is in a range in which the level of the first signal (s1) falls below a first threshold (s1) but exceeds a second, smaller threshold (s2) (s1>ABS(x1)>s2), a weighting function is formed which permits fading between the two formulas, such that the digital output signal (y) is formed from the sum of the first digital signal (x1) multiplied by the weight (g) and the sum of the negative current difference offset (b) multiplied by the inverse weight (1−g) and from the multiplication of the second digital signal (x2) by the assumed inverse amplification (a) (y=g*x1+(1−g)*(a*x2+b)) and furthermore the assumed inverse amplification and the assumed negative offset are actualized by recursive computation.

13. The process according to claim 1, characterized in that the weight (g) is a linear function and equal to the quotient of the difference between the level of the first digital signal (x1) and the second threshold (s2) divided by the difference between the first threshold (s1) and the second threshold (s2) (g=ABS(x1)−S2)/(s1−s2).

14. The process according to claim 1, characterized in that the level of the second digital signal (x2) is in a range in which it was provoked by overloading, determined by exceeding a first threshold (s1) of the level of the first digital signal (x1), and also in cases where the time since the level of the first digital signal (x1) exceeded the first threshold (s1) (ABS(x1)<s1) is less than a given time (t), the digital output signal (y) results from the first digital signal (x1), while in the other cases the procedure is as described before.

15. The process according to claim 14, characterized in that, in periodical sensing of the signal, the number of periods after the level of the first digital signal (x1) exceeds the first level is counted in order to obtain a standard for the time (t).

16. The process according to claim 2, characterized in that the recursive computation of the inverse difference-amplification and of the negative difference offset is performed only in the case of slow signal variations, determined when the difference of the last level and the present level of the first digital signal (x1) or of the second digital signal (x2) falls below the value of a differential threshold (s3), whereby it is possible to minimize an error provoked when the transit time of the second digital signal (x2) differs from that of the first digital signal (x1) in the signal processing stage.

17. The process according to claim 16, characterized in that when the differential threshold (s3) is exceeded, a recursive computation of the transit time difference is performed; that a third digital signal (x3) is calculated which corresponds to the second digital signal (x2) delayed by the calculated transit time, and that the third digital signal (x3) is used in place of the second digital signal (x2) in the equations for the calculation of the digital output signal (y).

18. The process according to claim 17, characterized in that when the differential threshold (s3) is exceeded, a recursive computation of the transit time difference is performed on the basis of a low-pass filter transit time; that a third digital signal (x3) is calculated, which corresponds to the second digital signal (x2) filtered by the calculated low-pass filter, and that the third digital signal (x3) is used in place of the second digital signal(x2) in the equations for computing the digital output signal (y).

19. The process according to claim 1, characterized in that in the case of unipolar analog signal the formation of the level of the first digital signal (x1) by comparison with the first threshold (s1) can be eliminated.

20. The process according to claim 1, characterized in that the first threshold (s1) is computed cyclically.

21. The process according to claim 20, characterized in that the first threshold (s1) is equal to the product of a constant (c), which is equal or smaller than one, multiplied by the full-scale value (FS) of the first digital signal (x1) multiplied by the inverse difference-amplification (a), and, if exist, plus the negative difference-offset (b) (s1=c*(a*FS+ b)), whereby any internal overloading near the first threshold (s1) is avoided.

22. The process according to claim 1 using a plurality of less highly resolving AD converters, characterized in that the analog signal is on the one hand converted without amplification to a first digital signal (x1) and, after plurality signal processings, generally error-containing amplifications greater than 1, with magnitudes of which need not be known precisely, to a plurality of digital signals (x2 . . . xn), proceeding according to claim 1 for each pair of digital signals, whereby a cascading takes place.

23. The process according to claim 1, characterized also in that the analog signal for obtaining the first digital signal (x1) is converted to the digital signal (x1) until after a signal processing, thus reducing especially transit time errors.

24. The process according to claim 1, characterized in that, a calibration signal is applied after power-up, cyclically or on demand to the system for the analog-digital converter, to determine new values for recursive computation.

* * * * *